United States Patent [19]

Hoffmeister et al.

[11] 4,396,861
[45] Aug. 2, 1983

[54] HIGH VOLTAGE LEAD-THROUGH

[75] Inventors: Dietrich Hoffmeister, Oberkochen; Wilhelm Egle, Königsbronn, both of Fed. Rep. of Germany

[73] Assignee: Carl Zeiss-Stiftung, Oberkochen, Fed. Rep. of Germany

[21] Appl. No.: 184,524

[22] Filed: Sep. 5, 1980

[30] Foreign Application Priority Data

Aug. 5, 1980 [DE] Fed. Rep. of Germany ....... 3029624

[51] Int. Cl.$^3$ ............................................. H01J 5/50
[52] U.S. Cl. .................................. 313/331; 313/250; 313/336; 313/268
[58] Field of Search ............... 313/336, 237, 236, 250, 313/331, 337, 259, 268

[56] References Cited

U.S. PATENT DOCUMENTS

| | | | |
|---|---|---|---|
| 3,042,828 | 7/1962 | Josephson | 313/237 X |
| 3,601,649 | 8/1971 | Steigerwald | 313/237 |
| 3,636,346 | 1/1972 | Akahori et al. | 313/282 |
| 3,988,627 | 10/1976 | Dustmann et al. | 313/336 |
| 4,057,746 | 11/1977 | Dumonte | 313/237 |
| 4,250,433 | 2/1981 | Bernard et al. | 313/237 |

Primary Examiner—Saxfield Chatmon, Jr.
Attorney, Agent, or Firm—Hopgood, Calimafde, Kalil, Blaustein & Judlowe

[57] ABSTRACT

The invention contemplates lead-through structure for the high-voltage electrode of an electron microscope or the like, in conjunction with shaping of the high-voltage electrode and of the body of insulating material via which the lead-through is supported, in reference to metal envelope structure. The high-voltage electrode has a step-wise enlargement, and the surface of the insulating material which is exposed to the vacuum commences at the start of the step-wise enlargement. As a result, the field strength along the vacuum-exposed insulator surface is so influenced that a minimum electric field strength is produced at the boundary line between the vacuum and the high-voltage electrode. The further result is to prevent occurrence of microdischarges.

12 Claims, 4 Drawing Figures

HIGH VOLTAGE LEAD-THROUGH

BACKGROUND OF THE INVENTION

The present invention relates to a high-voltage lead-through for introducing a high voltage into a vacuum, particularly for corpuscular-ray apparatus, consisting of a high-voltage electrode, an insulator surrounding the high-voltage electrode, and an outer electrode at a lower potential which surrounds the insulator. Corpuscular-ray apparatus includes, as is known, electron and ion microscopes as well as electron beam apparatus.

In electron beam apparatus the cathode has a high negative potential which must be sufficiently well insulated from the housing, which lies at ground potential. Because of the large potential difference, the development of the high-voltage lead-through and its insulator become of particular importance.

From West German Patent No. 763,347 it is already known to separate two electrodes by an insulator and, in order to provide assurance against external arcing, to develop the insulator in such a manner that the two ribs present on the ends of the insulator have a shell shape which is open towards the corresponding associated insulator end, into which shell shape the outer electrode parts which are under voltage extend.

From West German Patent No. 898 048 there is known a beam generator having two or more acceleration stages, in which the cathode is separated from the first acceleration electrode and the first acceleration electrode is separated from the second, etc. by in each case an insulator. Between every two insulators there is a voltage-conducting supporting ring which on its inside bears an accelerating electrode and on its outside a high-voltage connection for said electrode. The insulators are provided with a dish-shaped rib in order to lengthen the outer arcing path, the outer edge of said rib being widened in upward direction to form cylindrical insulator parts.

BRIEF STATEMENT OF THE INVENTION

In modern electron microscopes use has been made up to now without exception of so-called spark-plug insulators between high-voltage electrode and cathode. With these insulators sufficient resistance to arcing is obtained by a sufficiently long cylindrical surface. The demands made on such insulators increase, however, as the capability of the electron microscopes with respect to resolution increases. In particular, so-called micro-arc-overs along the surface of the insulator reduce the stability of the source of radiation and thus the quality of the image.

The object of the present invention is to create a high-voltage lead-through of the aforementioned type which, while being of compact construction, is characterized by high-voltage resistance and the avoidance of micro-arc-overs.

This object is achieved in accordance with the invention in the manner that the high-voltage lead-through has a step-wise enlargement and that the surface of the insulator which is exposed to the vacuum commences at the start of the enlargement and extends, at an angle to the axis of the outer electrode, towards the high-voltage electrode.

In one advantageous embodiment of the invention, the insulator surface which adjoins the vacuum forms, in the vicinity of the high-voltage electrode, an angle with the high-voltage electrode which is approximately half as large as the angle at the start of the step-wise enlargement of the high-voltage electrode.

Further advantageous embodiments of the invention are set forth in claims 3 to 9.

DETAILED DESCRIPTION

The invention will be described in further detail below with reference to FIGS. 1 to 3 of the accompanying drawings, in which FIG. 1 shows an illustrative embodiment of the high-voltage lead-through in cross section;

FIG. 4 shows the course of the equipotential lines in section with the new high voltage lead-through.

Figure 1:
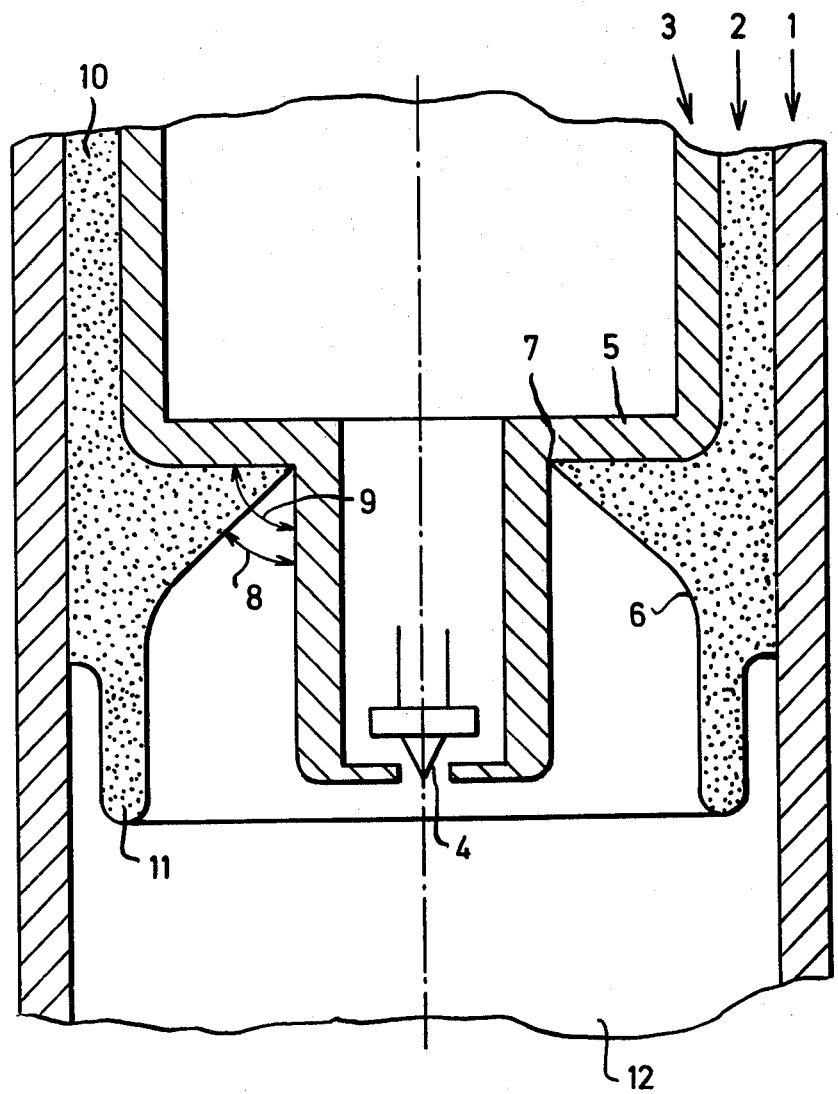

In FIG. 1, 3 is the high-voltage electrode, the so-called Wehnelt electrode. It is separated from the outer electrode 1 by the insulator 2. The outer electrode 1 lies at a lower potential than the high-voltage electrode, preferably at ground potential. 4 indicates diagrammatically the cathode of an electron beam generating system which also lies at negative high-voltage potential.

The high-voltage electrode 3 has a step-wise enlargement 5. The surface 6 of the insulator 2 which is exposed to the vacuum 12 commences at the start 7 of the step-wise enlargement 5. For reasons of manufacture it may be advantageous not to locate the start of the vacuum exposed insulator surface 6 precisely at the starting point 7 but merely in the vicinity thereof. For all practical purposes this makes no difference in the properties of the high-voltage lead-through or in the following explanation of these properties.

The action of the high-voltage lead-through of the invention is based on a favorable distribution of potential on the surface of the insulator exposed to the vacuum. From the literature (H. Boersch, Z.f.a. Physik 15, 518 (1963) it is known that microdischarges take place at the boundary line of minus-electrode-insulator-vacuum or residual gas, and from there produce a charge transport over the insulator surface. An attenuation of the electric field strength at this boundary line reduces the tendency towards micro-arc-overs. In the case of the known spark-plug insulator the cylindrical surface is approximately an equipotential surface; it can therefore only make a small contribution to the insulation resistance. The voltage present between the electrodes is maintained primarily at the two ends of the insulator. The electric field strength therefore has definite maxima at the insulator-electrodes boundary lines. As a result the production of microdischarges is strongly favored.

Figure 4:
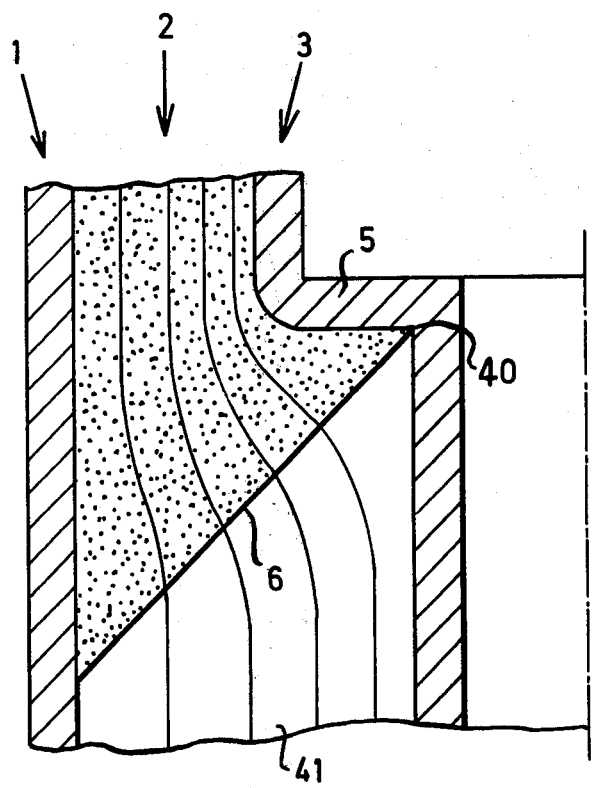

In the embodiment of the insulator shown, on the other hand, as a result of the step-wise enlargement of the high-voltage electrode and the start of the vacuum-exposed insulator surface at the start of said step-wise enlargement the course of the field strength along the insulator surface 6 is so influenced that a minimum electric field strength is produced at the boundary line 40, as indicated in FIG. 4 on basis of the equipotential lines 41. In this way the occurrence of microdischarges is prevented.

The course of the field strength along the insulator surface is strongly dependent on the geometry of the arrangement. In one advantageous embodiment of the invention, the insulator surface 6 which is exposed to the vacuum forms in the vicinity of the high-voltage electrode an angle 8 with the high-voltage electrode which is approximately half as large as the angle 9 at the start of the step-wise enlargement 5 of the high-voltage electrode.

It is obvious that a construction of high-voltage electrode and insulator which possesses rotational symmetry is most favorable for manufacture. The invention, however, is not limited to such embodiment since similar relationships apply for instance also to oval cross-sectional shapes.

The hot cathode designates 4 in FIG. 1 produces heat which must be removed. It is known that this is effected over the insertable high-voltage lead (not shown), using oil to provide sufficiently good heat contact and transport. In a preferred embodiment of the invention, the electrode surfaces for instance in the upper part of the insulator are developed with the largest possible surface, and the part 10 of the insulator located between same has only the thickness necessary for insulation in this region. The enlargement of the electrode surface which is necessary for this purpose can be combined with the step-wise enlargement of the high voltage electrode, as is also true in FIG. 1. With the development of the invention which has been described, the transfer of heat to the outer electrode 1 is so good that an oil-free, dry, high-voltage plug connection can be used.

The surface 6 of the insulator 2 which is exposed to the vacuum is provided in a further embodiment of the invention, in its low-voltage region with a downwardly projecting skirt 11 by which the voltage-distribution path length along surface 6 is enlarged. Skirt 11 is in this connection located so far to the outside, i.e., in the radial vicinity of the outer electrode 1, that the potential distribution on the high voltage electrode 3 is no longer disturbed. In the case of a good vacuum, the skirt is not necessary; however, it is advantageous in the event that the operating vacuum suddenly decreases when the high-voltage is connected, for instance as a result of a leak. Due to the longer insulation path, possible arc-overs along the insulator surface are in this case attenuated.

Figure 2:
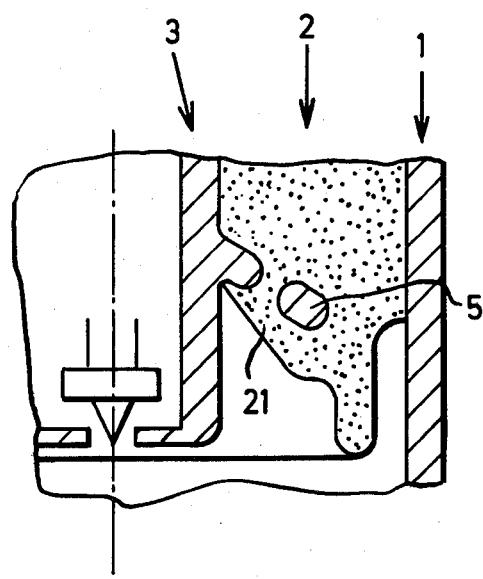
FIG. 2 shows another embodiment of the high-voltage lead-through in cross section, in which the high-voltage electrode has recesses for better anchoring to the insulator.

FIG. 2 shows another embodiment of the invention. In this case the step-wise enlargement (5) of the high-voltage electrode is limited to a smaller region. FIG. 2 furthermore shows that the angle at the point of inflection of the step-wise enlargement need not be 90°. The enlargement of the high-voltage electrode furthermore has recesses 21 which provide a better anchoring of the high-voltage electrode 3 to the insulator 2.

Figure 3:
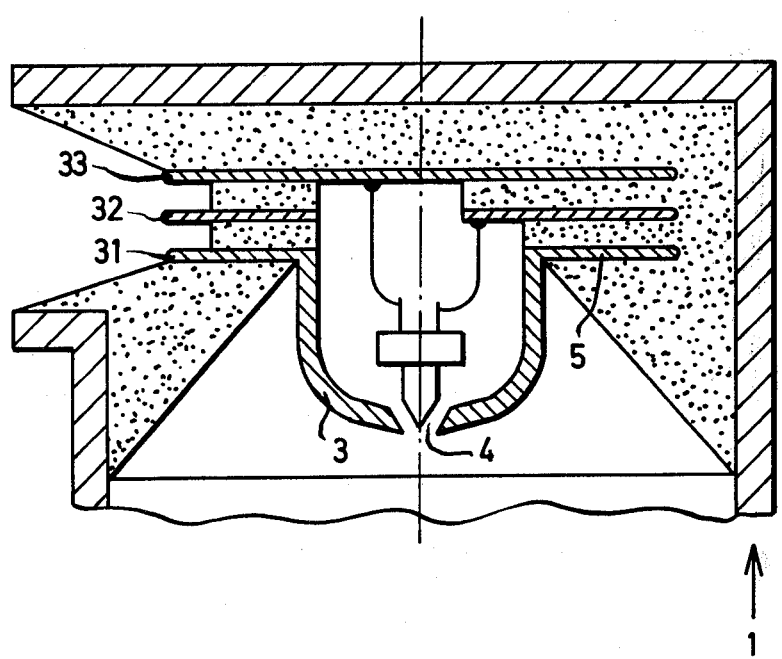
FIG. 3 shows another embodiment of the high-voltage lead-through in section, with lateral feeding of the high-voltage.

FIG. 3 shows an embodiment in which the feeding of the high voltage for the inner electrode is effected from the side. In this case the step-wise enlargement 5 of the high voltage electrode 3 can be used directly as high-voltage lead 31. 32 and 33 are the voltage leads to the cathode 4.

Preferred materials for the insulator are cast resin with filling composition, or ceramics. The surface 6 of the insulator which is exposed to the vacuum can be roughened in order to improve the leakage-current properties of the surface.

We claim:

1. A high-voltage lead-through construction for introducing a high voltage through an evacuated envelope and into the evacuated interior thereof, said construction comprising a tubular metal envelope portion, a high-voltage electrode including a first tubular portion within and uniformly spaced from said tubular metal envelope portion, and a body of solid insulating material filling the space between said tubular portions, said electrode further including a second and smaller tubular portion having an integrally formed step-reducing portion extending with vacuum exposure within said envelope portion, said body of insulating material extending within and being circumferentially bonded to said envelope portion in at least part of the region of smaller tubular-portion overlap by said envelope portion, and the vacuum-exposed end of said insulating body being characterized by a radially inward convergence in the direction of and substantially to juncture of said smaller tubular portion with said reducing portion.

2. The construction of claim 1, in which the angle of said convergence at approach to said juncture is approximately one half the effective angle between said smaller tubular portion and said reducing portion.

3. The construction of claim 1, in which the vacuum-exposed end of said insulating body is further characterized by an integrally formed dependent skirt in more closely spaced relation to said envelope portion than to said smaller tubular portion.

4. The construction of claim 3, in which said skirt projects at least in full longitudinal overlap with the vacuum-exposed end of said smaller tubular portion.

5. The construction of claim 1, in which, in the region of radially spaced overlap between said envelope portion and said first tubular portion, said radial spacing and therefore said body thickness is substantially the thickness needed essentially only for electrical insulation in said region of first-tubular-member overlap.

6. The construction of claim 1, in which said insulator body is a cast resin with a filling composition.

7. The construction of claim 1, in which said insulator body is of ceramic material.

8. The construction of claim 1, in which the vacuum-exposed surface of said body is of roughened texture.

9. A high-voltage lead-through construction for introducing a high voltage through an evacuated envelope and into the evacuated interior thereof, said construction comprising a tubular metal envelope portion, a high-voltage electrode including a cylindrical portion extending from a base end and with vacuum exposure within said envelope portion, said electrode base end including an integral generally radially outward enlargement having a peripheral contour uniformly spaced from and within said envelope portion, and a body of solid insulating material bonded to said enlargement and filling the space to said envelope portion, said body extending within and being circumferentially bonded to said envelope portion in at least part of the region of cylindrical-portion overlap by said envelope portion, and the vacuum-exposed end of said insulating body being characterized by a radially inward convergence in the direction of and substantially to juncture of said cylindrical portion with said generally radially outward enlargement.

10. The construction of claim 9, in which said generally radially outward enlargement is a flange embedded in said body of insulating material.

11. The construction of claim 10, in which said flange is apertured with insulating body material in the apertures of said flange.

12. The construction of claim 10, in which said envelope portion has a local side-access port in axial registration with said flange, said body of insulating material closing said access port with electrical high-voltage access to a locally exposed portion of said flange.

* * * * *